United States Patent [19]

Reimann et al.

[11] Patent Number: 4,970,255
[45] Date of Patent: Nov. 13, 1990

[54] FLAMEPROOF THERMOPLASTIC MOLDING MATERIALS BASED ON PARTLY AROMATIC AMIDE COPOLYMERS

[75] Inventors: Horst Reimann, Worms; Gunter Pipper, Bad Durkheim; Hans-Peter Weiss, Mutterstadt; Christoph Plachetta, Limburgerhof; Eckhard M. Koch, Fussgoenheim; Gerd Blinne, Bobenheim; Walter Goetz, Kaiserslautern; Peter Steiert, Ludwigshafen, all of Fed. Rep. of Germany

[73] Assignee: Basf Aktiengesellschaft, Ludwigshafen, Fed. Rep. of Germany

[21] Appl. No.: 377,263

[22] Filed: Jul. 10, 1989

[30] Foreign Application Priority Data

Jul. 13, 1988 [EP] European Pat. Off. ............ 88111172

[51] Int. Cl.⁵ .......................... C08K 5/09; C08K 5/10
[52] U.S. Cl. ..................................... 524/80; 524/318; 524/322; 524/399; 524/432
[58] Field of Search ................. 528/324, 339; 524/80, 524/321, 322, 432, 399, 394, 400, 318

[56] References Cited

U.S. PATENT DOCUMENTS

| | | | |
|---|---|---|---|
| 3,810,861 | 5/1974 | Tacke et al. | 524/394 |
| 3,882,076 | 5/1975 | Largman et al. | 524/606 |
| 4,024,115 | 5/1977 | Zahn et al. | 524/606 |
| 4,085,080 | 4/1978 | Elbert | 524/432 |
| 4,187,207 | 2/1980 | Cerny et al. | 524/432 |
| 4,242,240 | 12/1980 | Cerny et al. | 524/432 |
| 4,602,058 | 7/1986 | Graham et al. | 524/322 |
| 4,603,166 | 7/1986 | Poppe et al. | 524/606 |
| 4,762,910 | 8/1988 | Nielinger et al. | 528/339 |
| 4,791,027 | 12/1988 | Reimann et al. | 524/606 |

FOREIGN PATENT DOCUMENTS

| | | |
|---|---|---|
| 92776 | 4/1983 | European Pat. Off. |
| 141763 | 5/1985 | European Pat. Off. |
| 203737 | 11/1983 | Fed. Rep. of Germany |

Primary Examiner—Veronica P. Hoke
Attorney, Agent, or Firm—Oblon, Spivak, McClelland, Maier & Neustadt

[57] ABSTRACT

Flameproofed thermoplastic molding materials contain (A) 40-99% by weight of a partly aromatic amide copolymer consisting essentially of
  ($a_1$) 40-50% by weight of units derived from terephthalic acid and hexamethylenediamine,
  ($a_2$) 0-50% by weight of units derived from $\epsilon$-caprolactam and
  ($a_3$) 0-60% by weight of units derived from adipic acid and hexamethylenediamine, components ($a_2$) and/or ($a_3$) accounting altogether for not less than 10% by weight of the total number of units, (B) 1-30% by weight of a flameproofing combination of
  ($b_1$) 40-97% by weight of red phosphorus,
  ($b_2$) 1-50% by weight of an inorganic compound of a divalent or tetravalent metal,
  ($b_3$) 1-40% by weight of an organic mono- or dicarboxylic acid and
  ($b_4$) 1-40% by weight of an ester of an organic carboxylic acid of 6 to 24 carbon atoms with an alcohol of 2 to 24 carbon atoms or of a metal salt of such an acid, or a mixture of these, (C) 0-60% by weight of fibrous or particulate fillers or a mixture of these, and (D) 0-40% by weight of a polymeric impact modifier.

7 Claims, 1 Drawing Sheet

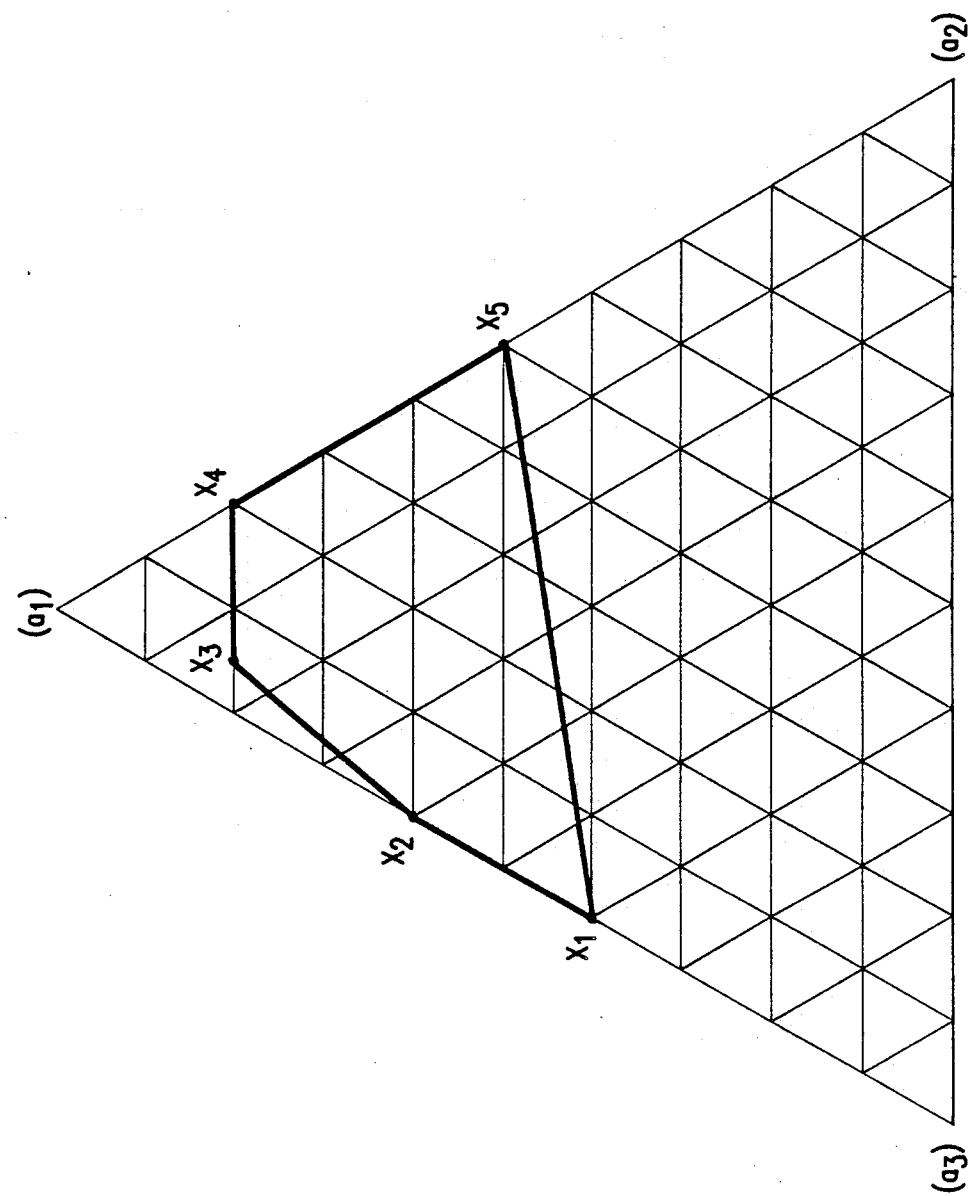

FLAMEPROOF THERMOPLASTIC MOLDING MATERIALS BASED ON PARTLY AROMATIC AMIDE COPOLYMERS

The present invention relates to flameproof thermoplastic molding materials containing (A) 40-99% by weight of a partly aromatic amide copolymer consisting essentially of
  ($a_1$) 40-90% by weight of units derived from terephthalic acid and hexamethylenediamine,
  ($a_2$) 0-50% by weight of units derived from ε-caprolactam and
  ($a_3$) 0-60% by weight of units derived from adipic acid and hexamethylenediamine,
components ($a_2$) and/or ($a_3$) accounting altogether for not less than 10% by weight of the total number of units, (B) 1-30% by weight of a flameproofing combination of
  ($b_1$) 40-97% by weight of red phosphorus,
  ($b_2$) 1-50% by weight of an inorganic compound of a divalent or tetravalent metal,
  ($b_3$) 1-40% by weight of an organic mono- or dicarboxylic acid and
  ($b_4$) 1-40% by weight of an ester of an organic carboxylic acid of 6 to 24 carbon atoms with an alcohol of 2 to 24 carbon atoms or of a metal salt of such an acid, or a mixture of these, (C) 0-60% by weight of fibrous or particulate fillers or a mixture of these, and (D) 0-40% by weight of a polymeric impact modifier.

EP-A 92776 discloses a process for flameproofing polyamides, in which 1-10% by weight of red phosphorus and 0.005-8% by weight of an inorganic or organic compound of a divalent or tetravalent metal are incorporated as a flameproofing agent into the polyamide. The metal compound is used as a concentrate in a polyolefin homopolymer or copolymer.

However, when this process is used for flameproofing polyamides having high melting points (>270° C.), problems occur because the red phosphorus no longer has sufficient stability. This leads to undesirable addition and degradation reactions of components, which finally also affect the mechanical properties of the end products.

Furthermore, the olefin homopolymers or copolymers are not sufficiently stable at relatively high temperatures, which, inter alia, may change the color of the end products.

EP-A 141 763 discloses molding materials which contain, as a flameproofing agent, a combination of red phosphorus and a lanthanide compound. These lanthanide compounds, even when used in a small amount, make the products considerably more expensive and, furthermore, stability problems occur in these systems for polyamides having fairly high melting points.

It is an object of the present invention to flameproof partly aromatic amide copolymers having a relatively high melting point with red phosphorus without stability problems occurring. Furthermore, the products should also have a well balanced property profile.

We have found that this object is achieved, according to the invention, by the thermoplastic molding materials defined at the outset. Preferred materials of this type are described in the subclaims.

The novel thermoplastic molding materials contain, as component A, 40-99, preferably 50-95, in particular 55-90, % by weight of a partly aromatic amide copolymer consisting of
  ($a_1$) 40-90% by weight of units derived from terephthalic acid and hexamethylenediamine,
  ($a_2$) 0-50% by weight of units derived from ε-caprolactam and
  ($a_3$) 0-60% by weight of units derived from adipic acid and hexamethylenediamine,
components ($a_2$) and/or ($a_3$) altogether accounting for not less than 10% by weight of the total number of units.

The partly aromatic amide copolymers contain, as component ($a_1$), 40-90% by weight of units derived from terephthalic acid and hexamethylenediamine. A small amount of terephthalic acid, preferably not more than 10% by weight of the total amount of aromatic dicarboxylic acid used, can be replaced by isophthalic acid or other aromatic dicarboxylic acids, preferably those in which the carboxyl groups are in the para-position.

In addition to the units derived from terephthalic acid and hexamethylenediamine, the amide copolymers contain units derived from ε-caprolactam and/or units derived from adipic acid and hexamethylenediamine.

The amount of units derived from ε-caprolactam is not more than 50, preferably 20-50, in particular 25-40, % by weight, while the amount of units derived from adipic acid and hexamethylenediamine is not more than 60, preferably 30-60, in particular 35-55, % by weight.

The amide copolymers (A) can also contain both units of ε-caprolactam and units of adipic acid and hexamethylenediamine; in this case, it must be ensured that the amount of units which are free of aromatic groups is not less than 10, preferably not less than 20, % by weight. The ratio of units derived from ε-caprolactam to those derived from adipic acid and hexamethylenediamine is not subject to any special restriction.

Preferred amide copolymers are those whose composition is inside the pentagon fixed by the apices $X_1$ to $X_5$ in the ternary diagram, the points $X_1$ to $X_5$ being defined as follows:

$X_1$
40% by weight of units ($a_1$)
60% by weight of units ($a_3$)
$X_2$
60% by weight of units ($a_1$)
40% by weight of units ($a_3$)
$X_3$
80% by weight of units ($a_1$)
5% by weight of units ($a_2$)
15% by weight of units ($a_3$)
$X_4$
80% by weight of units ($a_1$)
20% by weight of units ($a_2$)
$X_5$
50% by weight of units ($a_1$)
50% by weight of units ($a_2$)

In the FIGURE, the pentagon defined by these points is shown in a ternary diagram.

Polyamides containing 50-80, in particular 60-75, % by weight of units derived from terephthalic acid and hexamethylenediamine (units ($a_1$)) and 20-50, preferably 25-40, % by weight of units derived from ε-caprolactam (units ($a_2$)) have proven particularly advantageous for many intended uses.

In addition to the units (a$_1$) to (a$_3$) described above, the partly aromatic amide copolymers can also contain minor amounts, preferably not more than 15, in particular not more than 10, % by weight of further polymaide building blocks, as known for other polyamides. These building blocks may be derived from dicarboxylic acids of 4 to 16 carbon atoms and aliphatic or cycloaliphatic diamines of 4 to 16 carbon atoms, and from aminocarboxylic acids or corresponding lactams of 7 to 12 carbon atoms. Suitable monomers of this type which may be mentioned here merely by way of example are suberic acid, azelaic acid, sebacic acid and isophthalic acid, as typical dicarboxylic acids, 1,4-butanediamine, 1,5-pentanediamine, piperazine, 4,4'-diaminodicyclohexylmethane, 2,2-(4,4'-diaminodicyclohexyl)-propane and 3,3'-dimethyl-4,4'-diaminodicyclohexylmethane, as typical diamines, and capryllactam, enantholactam, omega-aminoundecanoic acid and laurolactam, as typical lactams and aminocarboxylic acids.

Advantageous partly aromatic amide copolymers have a triamine content of less than 0.5, preferably less than 0.3, % by weight.

Partly aromatic amide copolymers prepared by most of the processes disclosed to date have triamine contents greater than 0.5% by weight, which may lead to a deterioration in product quality and to problems in the continuous production. This problem is due in particular to dihexamethylenetriamine, which is formed from the hexamethylenediamine used in the preparation.

The melting points of the partly aromatic amide copolymers A are from 270° to 300° C., and this high melting point is also associated with a high glass transition temperature of, as a rule, more than 75°, in particular more than 85° C.

Binary amide copolymers based on terephthalic acid, hexamethylenediamine and ε-caprolactam containing about 70% by weight of units derived from terephthalic acid and hexamethylenediamine have melting points of about 300° C. and a glass transition temperature of more than 110° C.

Binary amide copolymers based on terephthalic acid, adipic acid and hexamethylenediamine have melting points of 300° C. or higher, even with relatively low contents of about 55% by weight of units of terephthalic acid and hexamethylenediamine, the glass transition temperature not being quite as high as in the case of binary amide copolymers which contain ε-caprolactam instead of adipic acid or adipic acid/hexamethylenediamine.

The partly aromatic amide copolymers can be prepared, for example, by the process decribed in EP-A 129 195 and 129 196.

In this process, an aqueous solution of the monomers, i.e. in this case the monomers which form the units (a$_1$) to (a$_3$), is heated to 250°–300° C. under superatmospheric pressure with simultaneous evaporation of water and formation of a prepolymer, after which the prepolymer and vapors are continuously separated, the vapors are rectified and the entrained diamines are recycled. Finally, the prepolymer is passed into a polycondensation zone and is subjected to polycondensation under 1–10 bar gage pressure and at 250°–300° C. In the process, it is important that the aqueous salt solution is heated under 1–10 bar gage pressure during a residence time of less than 60 seconds, the mixture emerging from the evaporator zone having a conversion of, advantageously, not less than 93% and a water content in the prepolymer of not more than 7% by weight.

As a result of these short residence times, the formation of triamines is substantially prevented.

The aqueous solutions used have, as a rule, a monomer content of 30–70, in particular 40–65, % by weight.

The aqueous salt solution is advantageously passed at 50°–100° C. continuously into an evaporator zone, where the aqueous salt solution is heated to 250°–330° C. under 1–10, preferably 2–6, bar gage pressure. Of course, the temperature used is above the melting point of the particular polyamide to be prepared.

As stated above, it is important that the residence time in the evaporator zone is not more than 60, preferably 10–55, in particular 10–40, seconds.

The conversion on emergence from the evaporator zone is not less than 93, preferably 95–98, % and the water content is preferably 2–5, in particular 1–3, % by weight.

The evaporator zone is advantageously in the form of a tube bundle. Tube bundles in which the cross-section of the individual tubes is alternately tubular and slot-like have proven useful.

It has also proven advantageous for the mixture of prepolymer and vapor to be fed, prior to phase separation, directly downstream of the evaporator zone, through a tubular mass transfer zone which is provided with baffles. The temperatures and pressure conditions used in the evaporator zone are maintained here. The baffles, for example packing, such as Raschig rings, metal rings or, in particular, packing consisting of wire mesh, produce a large surface area. As a result, the phases, i.e. prepolymer and vapor, are brought into intimate contact with one another. Consequently, the amount of diamine liberated with steam is considerably reduced. As a rule, a residence time of from 1 to 15 minutes is maintained in the mass transfer zone, which is advantageously in the form of a tube bundle.

The two-phase mixture consisting of vapor and prepolymer and emerging from the evaporator zone or mass transfer zone is separated. As a rule, separation occurs automatically owing to the physical differences in the vessel, the lower part of the vessel advantageously being in the form of a polymerization zone. The vapors liberated essentially consist of steam and diamines which have been liberated during evaporation of the water. These vapors are passed into a column and recitified. Examples of suitable columns are packed columns, bubble cap columns or sieve tray columns having from 5 to 15 theoretical plates. The column is advantageously operated under pressure conditions identical to those of the evaporator zone. The diamines present in the vapors are separated off here and recycled to the evaporator zone. It is also possible to feed the diamines to the downstream polymerization zone. The rectified steam obtained is removed at the top of the column.

The resulting prepolymer which, depending on its conversion, consists essentially of low molecular weight polyamide and may contain residual amounts of unconverted salts and as a rule has a relative viscosity of 1.2–1.7, is passed into a polymerization zone. In the polymerization zone, the melt obtained is subjected to polycondensation at 270°–330° C., in particular 270°–310° C., and under 1–10, in particular 2–6, bar gage pressure. Advantageously, the vapors liberated here are rectified together with the abovementioned vapors in the column, a residence time of 5–30 minutes preferably being maintained in the polycondensation zone. The resulting polyamide, which as a rule has a relative viscosity of 1.2-2.3, is removed continuously from the condensation zone.

In a preferred procedure, the polyamide thus obtained is passed in molten form through a discharge zone with simultaneous removal of the residual water present in the melt. Examples of suitable discharge zones are devolatilization extruders. The melt freed in this manner from water is then extruded and the extrudates are granulated. The granules obtained are advantageously condensed to the desired viscosity in the solid phase by means of superheated steam at below the melting point, for example 170°-240° C. The steam obtained at the top of the column is advantageously used for this purpose.

The relative viscosity after the solid-phase postcondensation is in general 2.2-5.0, preferably 2.3-4.5, measured in 1% strength solution (1 g/100 ml) in 96% strength by weight $H_2SO_4$ at 23° C.

In another preferred procedure, the polyamide melt discharged from the polycondensation zone is passed into a further polycondensation or finishing zone, where it is condensed to the desired viscosity with continuous formation of new surfaces at from 285° to 310° C., advantageously under reduced pressure, for example 1-500 mbar.

The novel molding materials contain, as component B, 1-40, preferably 3-30, in particular 5-25, % by weight of a flameproofing combination consisting of the components ($b_1$) to ($b_4$). Component ($b_1$), which accounts for 40-97, preferably 50-95, in particular 55-90, % by weight of the flameproofing combination B, is red phosphorus, which is a conventional flameproofing agent for polyamides. The red phosphorus used may be untreated red phosphorus or red phosphorus coated on the surface with silicone oil, liquid paraffin, esters of phthalic acid or adipic acid, phenol resins, aminoplasts or polyurethanes.

The red phosphorus can be incorporated directly or in the form of a concentrate in the form of a partly aromatic amide copolymer or, if necessary, in another polyamide.

Appropriate phosphorus products as well as methods for their incorporation are known to the skilled worker and are described in the literature.

Component ($b_2$) is an inorganic compound of a divalent or tetravalent metal; the amount used is 1-50, preferably 3-40, in particular 5-30, % by weight, based on the weight of the flameproofing combination B. Preferred compounds ($b_2$) are oxides, carbonates and oxide carbonates of the metals zinc, cadmium, aluminum, titanium or magnesium, zinc oxide and cadmium oxide being particularly preferred, and zinc oxide often being preferably used owing to its toxicological advantages.

The mono- or dicarboxylic acid ($b_3$) accounts for 1-40, preferably 1-30, in particular 2-10, % by weight of the flameproofing combination B.

Examples of dicarboxylic acids are oxalic acid, malonic acid, fumaric acid, maleic acid, adipic acid, and sebacic acid, of which the two last-mentioned acids, in particular sebacic acid, are preferred. It is of course also possible to used a mixture of a plurality of acids.

It is also possible in principle to use monocarboxylic acids (e.g. acrylic acid or methacrylic acid) as component ($b_3$), but dicarboxylic acids are generally preferred because they give better results.

Component ($b_4$) accounts for 1-40, preferably 2-25, in particular 3-20, % by weight, based on the total weight of the flameproofing combination B.

The organic acids of 6-24 carbon atoms, whose esters are suitable as component ($b_4$), are preferably pelargonic acid, palmitic acid, lauric acid, margaric acid, adipic acid, dodecanedioic acid or stearic acid, the last-mentioned acid generally being preferred. These are preferably esterified with n-butanol, n-octanol, stearyl alcohol, ethylene glycol, neopentylglycol, glycerol or pentaerythritol, in particular stearyl alcohol or glycerol, in order to obtain the esters ($b_4$).

From the above statements, it is evident that stearyl stearate and glycerol monostearate are preferred esters.

Instead of the esters, it is also possible to use metal salts of these acids, in particular aluminum salts, calcium salts or zinc salts. Of course, mixtures of different esters or different metal salts or mixtures of esters and metal salts can be used as component ($b_4$).

The novel thermoplastic molding materials may contain, as component C, not more than 60, preferably 5-50, in particular 10-40, % by weight of fibrous or particulate fillers or a mixture of these.

Examples of fibrous fillers are glass fibers, carbon fibers, Aramid fibers, potassium titanate fibers and fibrous silicates, such as wollastonite.

When glass fibers are used, they may be provided with a size or an adhesion promoter to improve the compatibility with the polyamide.

In general, the glass fibers used have a diameter of 6-20 μm. They may be incorporated both in the form of short glass fibers and in the form of rovings. In the finished injection-molded article, the mean length of the glass fibers is preferably from 0.08 to 5 mm.

Typical examples of particulate fillers here are glass spheres, particulate wollastonite, quartz powder, boron nitride, kaolin, calcium carbonate (chalk), magnesium carbonate and titanium dioxide, of which wollastonite, titanium dioxide and kaolin are generally preferred.

The novel thermoplastic molding materials may contain, as component (D), not more than 40, preferably 3-25% by weight of a polymeric impact modifier.

Preferred polymeric impact modifiers (elastomeric polymers) are polymers which are based on olefins and consist of the following components:

($d_1$) 40-100% by weight of one or more α-olefins of 2 to 8 carbon atoms, ($d_2$) 0-50% by weight of a diene, ($d_3$) 0-45% by weight of a $C_1$-$C_{12}$-alkyl ester of acrylic acid or methacrylic acid or a mixture of these esters, ($d_4$) 0-40% by weight of an ethylenically unsaturated mono- or dicarboxylic acid or a functional derivative of such an acid, ($d_5$) 0-40% by weight of a monomer containing epoxy groups and ($d_6$) 0-5% by weight of other monomers capable of undergoing free radical polymerization, with the proviso that the component (D) is not an olefin homopolymer, since the latter, for example with polyethylene, does not have the same advantageous effects with regard to the improvement of the toughness properties.

A first preferred group comprises the ethylene/propylene (EPM) and ethylene/propylene/diene (EPDM) rubbers, which preferably have a ratio of ethylene units to propylene units of from 40 : 60 to 90 : 10.

The Mooney viscosities (MLI+4/100° C.) of such, preferably uncrosslinked, EPM and EPDM rubbers (gel contents generally less than 1% by weight) are preferably from 25 to 100, in particular from 35 to 90 (measured at 100° C. according to DIN 53,523).

EPM rubbers generally have virtually no double bonds, whereas EPDM rubbers may have from 1 to 20 double bonds per 100 carbon atoms.

Examples of diene monomers ($d_2$) for EPDM rubbers are conjugated dienes, such as isoprene and butadiene, nonconjugated dienes of 5 to 25 carbon atoms, such as penta-1,4-diene, hexa-1,4-diene, hexa-1,5-diene, 2,5-dimethylhexa-1,5-diene and octa-1,4-diene, cyclic dienes, such as cyclopentadiene, cyclohexadienes, cyclooctadienes and dicyclopentadiene, and alkenylnorbornenes, such as 5-ethylidene-2-norbornene, 5-butylidene-2-norbornene, 2-methallyl-5-norbornene or 2-isopropenyl-5-norbornene, and tricyclodienes, such as 3-methyltricyclo[5.2.1.0.2.6]-3,8-decadiene, or a mixture of these. Hexa-1,5-diene-5-ethylidenenorbornene and dicyclopentadiene are preferred. The diene content of the EPDM rubbers is preferably from 0.5 to 50, in particular from 2 to 20, particularly preferably from 3 to 15, % by weight, based on the total weight of the olefin polymer.

EPM and EPDM rubbers may preferably also be grafted with reactive carboxylic acids or their derivatives. Particular examples are acrylic acid, methacrylic acid and their derivatives and maleic anhydride.

Another group of preferred olefin polymers comprises copolymers of α-olefins of 2 to 8 carbon atoms, in particular of ethylene, with $C_1$-$C_8$-alkyl esters of acrylic acid and/or methacrylic acid.

In principle, all primary, secondary and tertiary $C_1$-$C_{18}$-alkyl esters of acrylic acid or methacrylic acid are suitable, but esters of 1 to 12, in particular 2 to 10, carbon atoms are preferred.

Examples of these are methyl, ethyl, propyl, n-butyl, isobutyl, tert-butyl, 2-ethylhexyl, octyl and decyl acrylates and the corresponding esters of methacrylic acid. Of these, n-butyl acrylate and 2-ethylhexyl acrylate are particularly preferred.

The amount of the methacrylates and acrylates ($d_3$) in the olefin polymers is 0–60, preferably 10–50, in particular 30–45, % by weight.

Instead of the esters ($d_3$), or in addition to these, the olefin polymers may also contain monomers of ethylene unsaturated mono- or dicarboxylic acids ($d_4$), these monomers possessing acid functional groups and/or latent acid functional groups, or monomers ($d_5$) containing epoxy groups.

Examples of monomers ($d_4$) are acrylic acid, methacrylic acid, tertiary alkyl esters of these acids, in particular tert-butyl acrylate, and dicarboxylic acids, such as maleic acid and fumaric acid, and derivatives of these acids and their monoesters.

Monomers possessing latent acid functional groups are compounds which form free acid groups under the polymerization conditions or during incorporation of the olefinic polymers into the molding materials. Examples of these are anhydrides of dicarboxylic acids of not more than 20 carbon atoms, in particular maleic anhydride, and tertiary $C_1$-$C_{12}$-alkyl esters of the abovementioned acids, in particular tert-butyl acrylate and tert-butyl methacrylate.

The monomers possessing acid functional groups or latent acid functional groups and the monomers containing epoxy groups are preferably incorporated into the olefin polymers by adding to the monomer mixture compounds of the general formulae I-IV

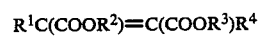

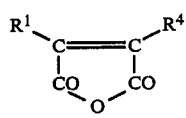

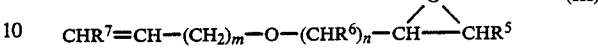

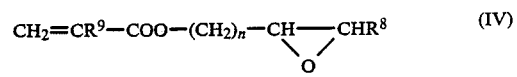

where $R^1$–$R^9$ are each hydrogen or alkyl of 1 to 6 carbon atoms, m is an integer of from 0 to 20 and n is an integer of from 0 to 10.

$R^1$–$R^7$ is preferably hydrogen, m is preferably 0 or 1 and n is preferably 1. The corresponding compounds are maleic acid, fumaric acid or maleic anhydride ($d_4$) or alkenyl glycidyl ether or vinyl glycidyl ethers ($d_5$).

Preferred compounds of the formulae I, II, III and IV are maleic acid and maleic anhydride as component ($d_4$), and epoxy-containing esters of acrylic acid and/or methacrylic acid, glycidyl acrylate and glycidyl methacrylate (as component $d_5$) being particularly preferred.

The amounts of components ($d_4$) and ($d_5$) are each from 0.07 to 40, in particular from 0.1 to 20, particularly from 0.15 to 15, % by weight, based on the total weight of the olefin polymers.

Particularly preferred olefin polymers are those consisting of from 50 to 98.9, in particular from 60 to 95, % by weight of ethylene, from 0.1 to 20, in particular from 0.15 to 15, % by weight of glycidyl acrylate and/or glycidyl methacrylate, acrylic acid and/or maleic anhydride, and from 1 to 45, in particular from 10 to 35, % by weight of n-butyl acrylate and/or 2-ethylhexyl acrylate.

Other preferred esters of acrylic and/or methacrylic acid are the methyl, ethyl, propyl, isobutyl and tert-butyl esters.

Suitable other monomers ($d_6$) are, for example, vinyl esters and vinyl ethers.

When such olefin polymers are used, their amount is preferably from 0 to 20, in particular from 4 to 18, very particularly from 5 to 15, % by weight, based on the total weight of the components (A) to (D).

The ethylene coplymers described above can be prepared by a conventional process, preferably by random copolymerization under superatmospheric pressure and at elevated temperatures.

The melt flow index of the ethylene copolymers is in general from 1 to 80 g/10 min (measured at 190° C. and under a load of 2.16 kg).

In addition to the above preferred elastomeric polymers based on olefins, examples of suitable elastomers (D) are the polymers below.

Examples of these are primarily emulsion polymers, whose preparation is described in, for example, Houben-Weyl, Methoden der organischen Chemie, Volume XII. I (1961) and by Blackley in the monograph Emulsion Polymerization.

In principle, it is possible to use random elastomers or those having a shell structure. The shell-structure is determined by the order of addition of the individual monomers.

Examples of monomers for the preparation of the rubber part of the elastomers are acrylates, such as n-butyl acrylate and 2-ethylhexyl acrylate, corresponding methacrylates, butadiene and isoprene and mixtures of these. These monomers can be copolymerized with further monomers, such as styrene, acrylonitrile, vinyl ethers and other acrylates or methacrylates, such as methyl methacrylate, methyl acrylate, ethyl acryalte and propyl acrylate.

The soft or rubber phase (having a glass transition temperature of less than 0° C.) of the elastomers may be the core, the outer shell or a middle shell (in the case of elastomers having a structure with more than two shells); in the case of multi-shell elastomers, a plurality of shells may consist of one rubber phase.

If, in addition to the rubber phase, one or more hard components (having glass transition temperatures of more than 20° C.) are present in the elastomer, they are generally prepared by polymerization of styrene, acrylonitrile, methacrylonitrile, α-methylstyrene, p-methylstyrene, acrylates and methacrylates, such as methyl acrylate, ethyl acrylate and methyl methacrylate, as principal monomers. In addition, this is another instance where minor amounts of other comonomers can be used.

In some cases, it has proven advantageous to use emulsion polymers which have reactive groups at the surface. Examples of such groups are epoxy, carboxyl, latent carboxyl, amino and amide groups and functional groups which can be introduced by the concomitant use of monomers of the general formula

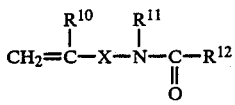

where $R^{10}$ is hydrogen or $C_1$–$C_4$-alkyl, $R^{11}$ is hydrogen, $C_1$–$C_8$-alkyl or aryl, in particular phenyl, $R^{12}$ is hydrogen, $C_1$–$C_{10}$-alkyl, $C_6$–$C_{12}$-aryl or $OR^{13}$, $R^{13}$ is a $C_1$–$C_8$-alkyl or $C_6$–$C_{12}$-aryl group which may be substituted by O- or N-containing groups, X is a chemical bond, $C_1$–$C_{10}$-alkylene or $C_6$–$C_{12}$-arylene or

Y is O—Z— or NH—Z— and Z is $C_1$–$C_{10}$-alkylene or $C_6$–$C_{12}$-arylene.

The graft monomers described in EP-A 208 187 are also suitable for the introduction of reactive groups at the surface.

Further examples are acrylamide, methacrylamide and substituted esters of acrylic acid and methacrylic acid, such as (N-tert-butylamino)-ethyl methacrylate, (N,N-dimethylamino)-ethyl acrylate, (N,N-dimethylamino)methyl acrylate and (N,N-diethylamino)-ethyl acrylate.

The particles of the rubber phase may also be crosslinked. Examples of crosslinking monomers are buta-1,3-diene, divinylbenzene, diallyl phthalate and dihydrodicyclopentadienyl acrylate, and the compounds described in EP-A 50 265.

It is also possible to use graft-linking monomers, i.e. monomers having two or more polymerizable double bonds which react at different rates during the polymerization. Preferably used compounds are those in which one or more double bonds undergo polymerization at about the same rate as the other monomers while the remaining double bonds polymerize substantially more slowly. The different rates of polymerization result in a certain proportion of unsaturated double bonds being introduced into the rubber. If a further phase is subsequently grafted onto such a rubber, some or all of the double bonds present in the rubber react with the graft monomers with formation of chemical bonds, i.e. the grafted phase is wholly or partly linked to the grafting base via chemical bonds.

Examples of such graft-linking monomers are allyl-containing monomers, in particular allyl esters of ethylenically unsaturated carboxylic acids, such as allyl acrylate, allyl methacrylate, diallyl maleate, diallyl fumarate or diallyl itaconate, and the corresponding monoallyl compounds of these dicarboxylic acids. There is also a large number of other suitable graft-linking monomers; for further details, reference may be made in this context to, for example, U.S. Pat. No. 4,148,846.

In general, the amount of these crosslinking monomers in component (D) is not more than 5, preferably not more than 3, % by weight, based on (D).

Some preferred emulsion polymers are listed below. Primary examples here are graft polymers having a core and one or more outer shells and possessing the following structure:

| Type | Monomers for the core | Monomers for the shell |
|---|---|---|
| D/1 | Buta-1,3-diene, isoprene, n-butyl acrylate, ethylhexyl acrylate or mixtures of these | Styrene, acrylonitrile, methyl methacrylate |
| D/2 | As for A but with the concomitant use of crosslinking agents | As for A |
| D/3 | As for A or B | n-Butyl acrylate, ethyl acrylate, methyl acrylate, buta-1,3-diene, isoprene, ethylhexyl acrylate |
| D/4 | As for A or B | As for A or C but with the concomitant use of monomers having reactive groups as described herein. |
| D/5 | Styrene, acrylonitrile, methyl methacrylate or mixtures of these | First shell consisting of monomers as described under A and B for the core Second shell as described under A or C for the shell |

Instead of graft polymers having a multi-shell structure, it is also possible to use homogeneous, i.e. single-shell elastomers of buta-1,3-diene, isoprene and n-butyl acrylate or their copolymers. These products too can be prepared by the concomitant use of crosslinking monomers or monomers having reactive groups.

Examples of preferred emulsion polymers are n-butyl acrylate/(meth)acrylic acid copolymers, n-butyl acrylate/glycidyl acrylate or n-butyl acrylate/glycidyl methacrylate copolymers, graft polymers having an inner core of n-butyl acrylate or based on butadiene and an outer shell of the abovementioned copolymers and copolymers of ethylene with comonomers which provide reactive groups.

The elastomers (D) described can also be prepared by other conventional processes, for example by suspension polymerization.

In addition to the essential components (A) and (B), and if necessary (C) and (D), the novel molding materials may contain conventional additives and processing assistants. The amount of these in general is not more than 20, preferably not more than 10, % by weight, based on the total weight of components (A) to (D).

Examples of conventional additives are stabilizers and antioxidants, heat stabilizers and ultraviolet stabilizers, lubricants and mold release agents, dyes and pigments and plasticizers.

Antioxidants and heat stabilizers which may be added to the thermoplastic materials according to the invention are, for example, halides of metals of group I of the Periodic Table, for example sodium halides, potassium halides and lithium halides, if necessary in combination with copper(I) halides, for example chlorides, bromides or iodides. Zinc fluoride and zinc chloride may also be used. Sterically hindered phenols, hydroquinones, substituted members of this group and mixtures of these compounds, preferably in concentrations of not more than 1% by weight, based on the weight of the mixture, can also be used.

Examples of UV stabilizers are various substituted resorcinols, salicylates, benzotriazoles and benzophenones, which may be used in general in amounts of not more than 2% by weight.

Lubricants and mold release agents, which as a rule are added in amounts of not more than 1% by weight to the thermoplastic material are stearic acid, stearyl alcohol, alkyl stearates and stearylamides and esters of pentaerythritol with long-chain fatty acids.

The additives include stabilizers which prevent the decomposition of the red phosphorus in the presence of moisture and atmospheric oxygen. Examples are compounds of cadmium, of zinc, of aluminum, of tin, of magnesium, of manganese and of titanium. Particularly suitable compounds are, for example, oxides of the stated metals, as well as carbonates or oxycarbonates, hydroxides and salts of organic or inorganic acids, such as acetates or phosphates or hydrogen phosphates.

for example for the production of electrical plug conectors and circuit board substrates, is particularly noteworthy.

EXAMPLES

The following components were used for the preparation of thermoplastic molding materials:

Component A

A/1: Partly aromatic amide copolymer of units $a_1$ and $a_2$ in a ratio of 70 : 30, having a relative viscosity of 2.50 (determined in a concentration of 1 g/100 ml in 98% strength by weight $H_2SO_4$) and prepared by the process described in EP-A 129 195. The triamine content was about 0.2% by weight.

A/V: Polyhexamethyleneadipamide having an $\eta_{rel}$ of 2.70 (measured as for A/1; Ultramid ® A3 from BASF)

Component B $b_1$: Red phosphorus (Exolit ® 385 from Hoechst-Knapsack)
$b_2/1$: Zinc oxide
$b_2/2$: Cadmium oxide
$b_3$: Sebacic acid
$b_4$: Stearyl stearate
C: Glass fibers Components A, $b_1$–$b_4$ and C were mixed in a twin-screw extruder from Werner & Pfleiderer at 310° C., the mixture was extruded and the extrudates were granulated. To determine the phosphorous stability, the granules were converted into standard small bars (50×6×4 mm) by injection molding and were stored in 150 ml of water in an open vessel at 60° C., the amount of water being kept constant.

After 14, 30 and 50 days, samples were taken from the aqueous phase and the total amount of dissolved phosphorous compounds in the samples was determined.

The composition of the individual materials and the results of the determinations are shown in the Table.

TABLE

| | (V = Comparative Examples) | | | | |
|---|---|---|---|---|---|
| | Example | | | | |
| Component | 1 | 2 | 3V | 4V | 5V |
| A [% by wt.] | 66.95 A/1 | 66.85 A/1 | 67.65 A/1 | 67.85 A/V | 67.05 A/V |
| $b_1$ [% by wt.] | 6.8 | 6.8 | 6.8 | 6.8 | 6.8 |
| $b_2$ [% by wt.] | 0.7 $b_2/1$ | 0.8 $b_2$2 | — | — | 0.8 $b_2/1$ |
| $b_3$ [% by wt.] | 0.2 | 0.2 | 0.2 | — | — |
| $b_4$ [% by wt.] | 0.35 | 0.35 | 0.35 | 0.35 | 0.35 |
| C | 25.0 | 25.0 | 25.0 | 25.0 | 25.0 |
| Dissolved phosphorous [ppm] | | | | | |
| After 14 days | 6 | 7 | 15 | 185 | 50 |
| After 30 days | 16 | 20 | 37 | 315 | 56 |
| After 50 days | 32 | 45 | 85 | 445 | 91 |

The novel thermoplastic molding materials can be prepared by a conventional process, by mixing the starting components in a conventional mixing apparatus, such as an extruder, a Brabender mill or a Banbury mill, and then extruding the mixture. After extrusion, the extrudate is cooled and comminuted. The mixing temperatures are in general from 270° to 330° C.

The novel flameproofed molding materials have good phosphorous stability and a well balanced property spectrum.

They are therefore suitable for the production of fibers, films and moldings, and, because of the good phosphorous stability, their use in the electronics sector, The materials of the novel Examples 1 and 2 showed no changes in the molecular weight of component A, whereas in Example 3V the molecular weight was found to increase.

In general, the Examples indicate the advantageous properties of the novel molding materials and the effect of the composition of the flameproofing combination on phosphorus stability. Particularly noteworthy is the fact that ZnO gives better results than CdO, which is generally not the case for conventional polyamides (where CdO generally has a better effect than ZnO). Because of reservations about CdO in respect of its toxicity, this is a considerable advantage.

We claim:

1. A flameproofed thermoplastic molding material, containing
   (A) 40–99% by weight of a partly aromatic amide copolymer consisting essentially of
      ($a_1$) 40–90% by weight of units derived from terephthalic acid and hexamethylenediamine,
      ($a_2$) 0–50% by weight of units derived from $\epsilon$-caprolactam and
      ($a_3$) 0–60% by weight of units derived from adipic acid and hexamethylenediamine,
      components ($a_2$) or ($a_3$) or a mixture of these accounting altogether for not less than 10% by weight of the total number of units,
   (B) 1–30% by weight of a flameproofing combination of
      ($b_1$) 40–97% by weight of red phosphorus,
      ($b_2$) 1–50% by weight of an inorganic compound of a divalent or tetravalent metal,
      ($b_3$) 1–40% by weight of an organic mono- or dicarboxylic acid and
      ($b_4$) 1–40% by weight of an ester of an organic carboxylic acid of 6 to 24 carbon atoms with an alcohol of 2 to 24 carbon atoms or of a metal salt of such an acid, or a mixture of these,
   (C) 0–60% by weight of fibrous or particulate fillers or a mixture of these, and
   (D) 0–40% by weight of a polymeric impact modifier.

2. A flameproofed thermoplastic molding material as claimed in claim 1, wherein zinc oxide, cadmium oxide or a mixture of zinc oxide and cadmium oxide is present as 3. A flameproofed thermoplastic molding material as claimed in claim 1, wherein sebacic acid is present as component ($b_3$).

4. A flameproofed thermoplastic molding material as claimed in claim 1, wherein an ester of stearic acid with an alcohol of 6 to 24 carbon atoms or an aluminum, zinc or calcium salt of stearic acid or a mixture of these compounds is present as component $b_4$).

5. A flameproofed thermoplastic molding material as claimed in claim 1, which has the following compositions:
   (A) 40–99% by weight of a partly aromatic amide copolymer
   (B) 1–40% by weight of a flameproofing combination of
      ($b_1$) 40–90% by weight of red phosphorus,
      ($b_2$) 5–50% by weight of zinc oxide or cadmium oxide or a mixture of these,
      ($b_3$) 1–40% by weight of sebacic acid
      ($b_4$) 1–40% by weight of styeryl stearate, zinc stearate, aluminum stearate, calcium stearate or a mixture of these.

6. A circuit board substrate produced from a thermoplastic molding material as claimed in claim 1.

7. An electrical plug connector produced from a thermoplastic molding material as claimed in claim 1.

* * * * *